US012696779B2

(12) United States Patent
Jin

(10) Patent No.: US 12,696,779 B2
(45) Date of Patent: Jul. 28, 2026

(54) PACKAGING STRUCTURE AND PACKAGING METHOD

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 527 days.

(21) Appl. No.: 18/096,299

(22) Filed: Jan. 12, 2023

(65) Prior Publication Data

US 2023/0352417 A1    Nov. 2, 2023

(30) Foreign Application Priority Data

Apr. 29, 2022    (CN) .......................... 202210465442.8

(51) Int. Cl.
| | |
|---|---|
| *H10W 70/65* | (2026.01) |
| *H10B 80/00* | (2026.01) |
| *H10W 20/20* | (2026.01) |
| *H10W 70/60* | (2026.01) |
| *H10W 72/00* | (2026.01) |
| *H10W 90/00* | (2026.01) |

(52) U.S. Cl.
CPC ............ *H10W 70/65* (2026.01); *H10B 80/00* (2023.02); *H10W 20/20* (2026.01); *H10W 70/611* (2026.01); *H10W 72/072* (2026.01); *H10W 90/701* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 9,379,074 | B2 * | 6/2016 | Uzoh ................... | H10W 90/701 |
| 9,941,253 | B1 * | 4/2018 | Jung ..................... | H10W 90/00 |
| 2015/0206867 | A1 * | 7/2015 | Lim ...................... | H10W 90/00 |
| | | | | 257/676 |

(Continued)

*Primary Examiner* — Khaja Ahmad
(74) *Attorney, Agent, or Firm* — Crowell & Moring LLP

(57) ABSTRACT

This disclosure relates to a packaging structure and a packaging method. The packaging structure includes: a substrate; an interconnecting structure, bonded to the substrate, the interconnecting structure is electrically connected to the substrate; a chipset, including a plurality of first chips stacked along a longitudinal direction, the first chip adjacent to the interconnecting structure is used as a bottom chip, each of the rest of the first chips is used as a top chip, the bottom chip is electrically connected to the interconnecting structure, adjacent first chips along the longitudinal direction are electrically connected, and a portion of the bottom chip is exposed from the top chip; a conductive post, arranged on the interconnecting structure on a side of the chipset and electrically connected to the interconnecting structure; and a second chip, bonded to the bottom chip exposed from the top chip and to the conductive post.

14 Claims, 6 Drawing Sheets

(56) References Cited

U.S. PATENT DOCUMENTS

| | | | |
|---|---|---|---|
| 2015/0214207 A1* | 7/2015 | Yoshida | H10W 90/00 |
| | | | 438/109 |
| 2017/0062384 A1* | 3/2017 | Lee | H01L 23/5386 |
| 2019/0273065 A1* | 9/2019 | Yu | H01L 23/538 |
| 2020/0335479 A1* | 10/2020 | Li | H01L 21/6836 |
| 2021/0143128 A1* | 5/2021 | Choi | G11C 5/025 |

* cited by examiner

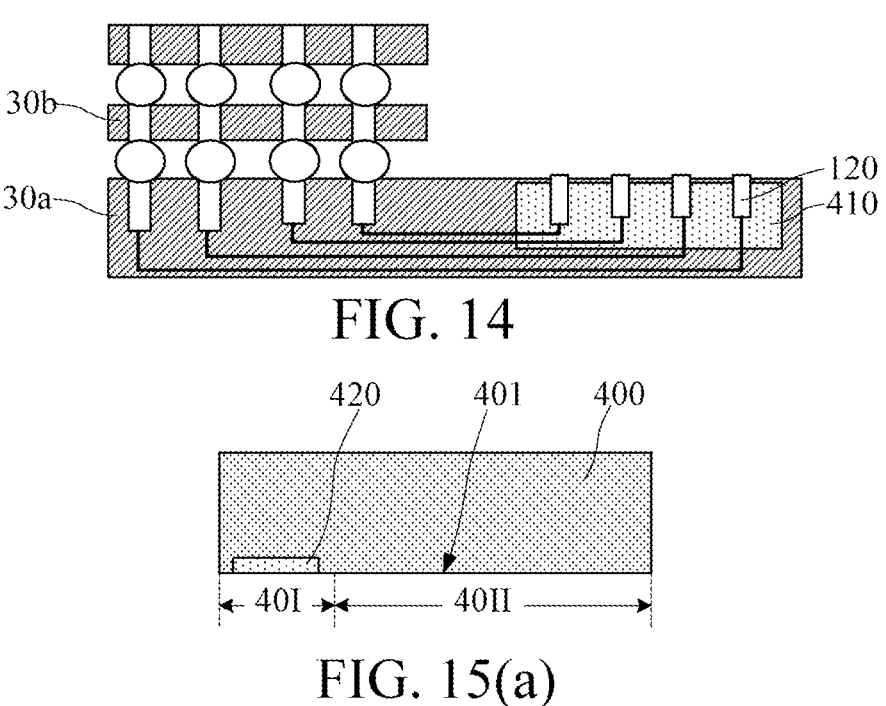
FIG. 14
FIG. 15(a)
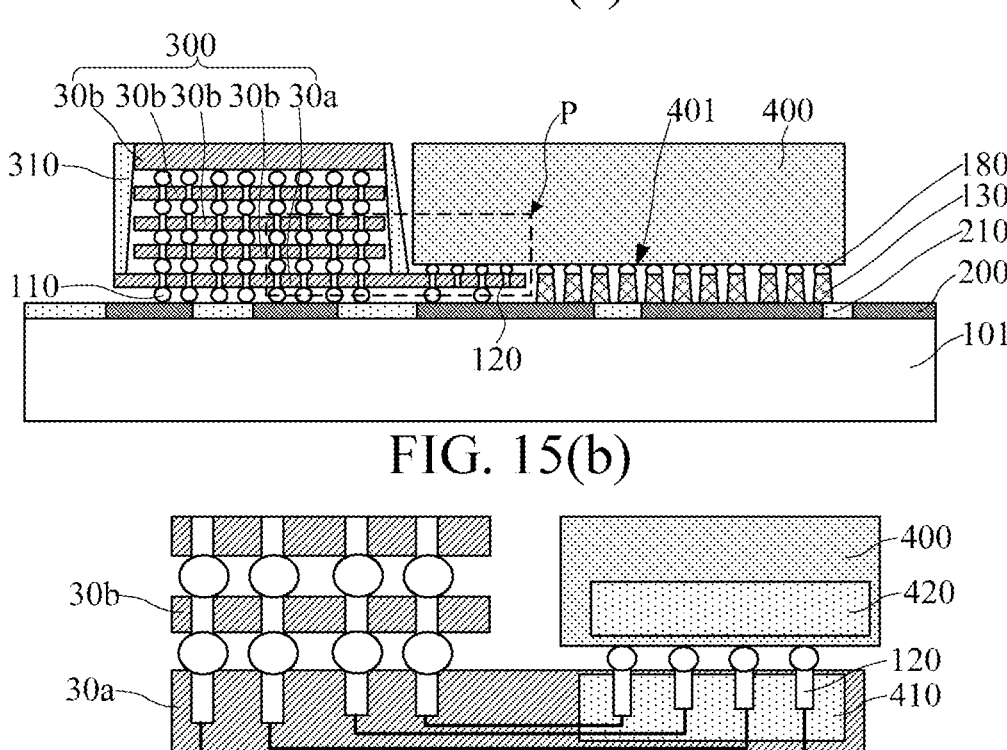
FIG. 15(b)
FIG. 16

PACKAGING STRUCTURE AND PACKAGING METHOD

CROSS REFERENCE TO RELATED APPLICATIONS

This application is based on and claims priority to Chinese patent Application No. 202210465442.8, filed Apr. 29, 2022, the entire content of which is incorporated herein by reference.

TECHNICAL FIELD

The present disclosure relates to the field of semiconductor packaging, and in particular, to a packaging structure and a packaging method.

BACKGROUND

A conventional chip manufacturing technology is being pushed to a limit in terms of a size of a single chip. However, applications are eager for a latest technology to realize a large-scale integrated circuit, and it is a challenge to achieve high-speed and small-volume interconnection between chips.

A current solution is a relatively small integrated circuit with a silicon bridge (Si bridge) chip being embedded in a silicon substrate. The Si bridge is used to realize interconnection between chips, thereby providing heterogeneous chip packaging.

However, current packaging structures are relatively complex, and a speed of communication between chips is to be improved.

SUMMARY

The forms of the present disclosure provide a packaging structure and a packaging method, to improve a speed of communication of the packaging structure and optimize performance of the packaging structure.

In an aspect of the present disclosure, a packaging structure is provided. The packaging structure may include: a substrate; an interconnecting structure, bonded to the substrate, the interconnecting structure is electrically connected to the substrate; a chipset, including a plurality of first chips stacked along a longitudinal direction, where the first chip adjacent to the interconnecting structure is used as a bottom chip, each of the rest of the first chips is used as a top chip, the bottom chip is electrically connected to the interconnecting structure, adjacent first chips along the longitudinal direction are electrically connected, and a portion of the bottom chip is exposed from the top chip; a conductive post, arranged on the interconnecting structure on a side of the chipset and electrically connected to the interconnecting structure; and a second chip, bonded to the bottom chip exposed from the top chip and to the conductive post, the second chip is electrically connected to the bottom chip and the conductive post.

In another aspect of the present disclosure, a packaging method is provided. The packaging method may include: providing a carrier substrate; forming an interconnecting structure on the carrier substrate, where the interconnecting structure includes a first interconnecting region configured to connect to a chipset and a second interconnecting region configured to connect to a second chip; bonding a chipset to the first interconnecting region of the interconnecting structure, where the chipset includes a plurality of first chips stacked along a longitudinal direction, the first chip adjacent to the interconnecting structure is used as a bottom chip, each of the rest of the first chips is used as a top chip, the bottom chip is electrically connected to the interconnecting structure, adjacent first chips along the longitudinal direction are electrically connected, and a portion of the bottom chip is exposed from the top chip; forming a conductive post on the second interconnecting region of the interconnecting structure, where the conductive post is electrically connected to the interconnecting structure; providing a second chip; bonding a second chip to the bottom chip exposed from the top chip and to the conductive post, the second chip is electrically connected to the bottom chip and the conductive post; removing the carrier substrate to expose a side of the interconnecting structure facing away from the chipset and the second chip; and bonding a substrate to the side of the interconnecting structure facing away from the chipset and the second chip, the substrate is electrically connected to the interconnecting structure.

Compared with the prior art, the forms of the present disclosure have the following advantages.

According to the packaging structure provided in the forms of the present disclosure, since a portion of the bottom chip is exposed from the top chip, a space can be provided for bonding a portion of the second chip to the bottom chip, so that the second chip can be directly stacked on and bonded to the bottom chip exposed from the top chip, thereby electrically connecting the second chip to the first chip. Compared with electrically connecting the second chip to the first chip by a bridge, in the forms of the present disclosure, the bridge is omitted, which helps simplify a packaging process and the packaging structure, thin the packaging structure, and shorten a transmission path between the second chip and the first chip, thereby improving a speed of communication between the second chip and the first chip, and optimizing performance of the packaging structure. In addition, the conductive post can offset a height difference between a top surface of the interconnecting structure and a top surface of the bottom chip, which helps provide a surface having a same height for bonding the second chip, thereby reducing difficulty of bonding the second chip, and improving performance of connection of the second chip to the bottom chip and to the interconnecting structure.

According to the packaging method provided in the forms of the present disclosure, the chipset is bonded to the first interconnecting region of the interconnecting structure, a portion of the bottom chip is exposed from the top chip, and the conductive post is further formed on the second interconnecting region of the interconnecting structure. Therefore, the second chip can be bonded to the bottom chip exposed from the top chip and to the conductive post, the second chip is electrically connected to the bottom chip and the conductive post. Since a portion of the bottom chip is exposed from the top chip, a space can be provided for bonding a portion of the second chip to the bottom chip, so that the second chip can be directly stacked on and bonded to the bottom chip exposed from the top chip, thereby electrically connecting the second chip to the first chip. Compared with electrically connecting the second chip to the first chip by a bridge, in the forms of the present disclosure, the bridge is omitted, which helps simplify a packaging process and the packaging structure, thin the packaging structure, and shorten a transmission path between the second chip and the first chip, thereby improving a speed of communication between the second chip and the first chip, and optimizing performance of the packaging structure. In addition, the conductive post can offset a height difference between a top surface of the interconnecting structure and a top surface of the bottom chip, which helps provide a surface having a same height for bonding the second chip, thereby reducing difficulty of bonding the second chip, and improving performance of connection of the second chip to the bottom chip and to the interconnecting structure.

BRIEF DESCRIPTION OF THE DRAWINGS

FIG. 4 to FIG. 6 are schematic structural diagrams of a packaging structure according to a form of the present disclosure.

FIG. 7 to FIG. 20 are schematic structural diagrams corresponding to steps in a packaging method according to a form of the present disclosure.

DETAILED DESCRIPTION

It can be learned from the background that, current packaging structures are relatively complex, and a speed of communication between chips is to be improved. The reason why the current packaging structures are relatively complex and the speed of communication between chips is to be improved is analyzed with reference to two types of packaging structures.

Figure 1:
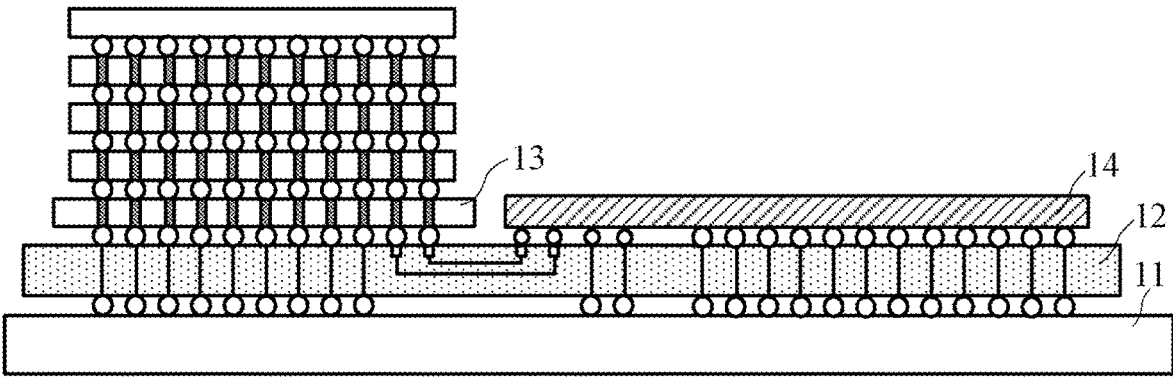
FIG. 1 is a schematic structural diagram of a packaging structure.

FIG. 1 is a schematic structural diagram of a packaging structure. The packaging structure includes: a substrate 11; an interposer 12, bonded to the substrate 11; one or more first chips 13, stacked in sequence from a bottom to a top and bonded to the interposer 12; and a second chip 14, bonded to the interposer 12 on a side of the first chip 13, so that the second chip 14 is electrically connected to the first chip 13 by the interposer 12.

In the packaging structure, the first chip 13 is electrically connected to the substrate 11 by the interposer 12, the second chip 14 is electrically connected to the substrate 11 by the interposer 12, and the second chip 14 is electrically connected to the first chip 13 by the interposer 12, which helps improve a speed of communication and performance of connection between the first chip 13 and the second chip 14.

However, in the field of semiconductor packaging, an area of the interposer 12 is relatively large, and costs of the interposer are relatively high, which tend to increase packaging costs. In addition, electrically connecting the chips and connecting the chip to the substrate by the interposer 12 tends to complex the packaging structure.

Figure 2:
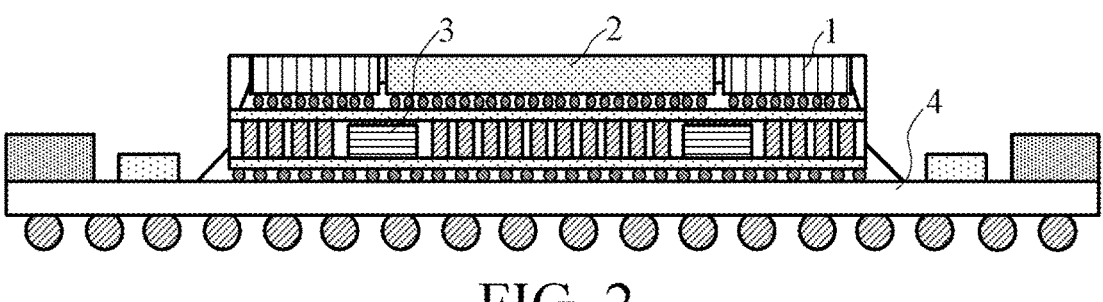
FIG. 2 and FIG. 3 are schematic structural diagrams of another packaging structure.
Figure 3:
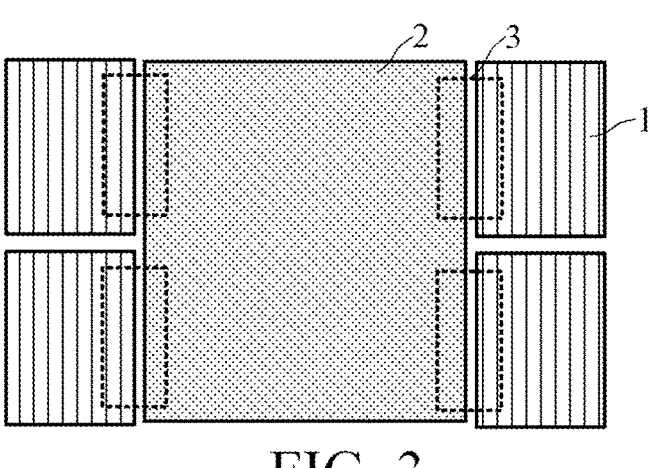

FIG. 2 to FIG. 3 are schematic structural diagrams of another packaging structure. FIG. 2 is a cross-sectional view, and FIG. 3 is a top view corresponding to FIG. 2. The packaging structure includes: a substrate 4; a bridge 3, bonded to the substrate 4; a packaging layer (not shown), arranged on the substrate and covering a sidewall of the bridge 3; a first chip 1, bonded to the packaging layer and the bridge 3 and electrically connected to the bridge 3; and a second chip 2, bonded to the packaging layer exposed from the first chip 1 and to the bridge 3 and electrically connected to the bridge 3. The second chip 2 is connected to the first chip 1 by the bridge 3.

Electrically connecting the first chip 1 to the second chip 2 by the bridge 3 having lower costs in the packaging structure helps reduce the costs of the packaging structure compared with electrically connecting the first chip to the second chip by the interposer.

However, electrically connecting the first chip 1 to the second chip 2 by the bridge 3 still leads to relatively complex packaging process and structure and a relatively long transmission path between the first chip 1 and the second chip 2, resulting in a difficulty in improving the speed of communication between the first chip 1 and the second chip 2.

In order to address the above problem, a form of the present disclosure provides a packaging structure. A portion of a bottom chip is exposed from a top chip, so that a space can be provided for bonding a portion of the second chip to the bottom chip, and therefore the second chip can be directly stacked on and bonded to the bottom chip exposed from the top chip, thereby electrically connecting the second chip to the first chip. Compared with electrically connecting the second chip to the first chip by a bridge, in the forms of the present disclosure, the bridge is omitted, which helps simplify a packaging process and the packaging structure, thin the packaging structure, and shorten a transmission path between the second chip and the first chip, thereby improving a speed of communication between the second chip and the first chip, and optimizing performance of the packaging structure. In addition, a conductive post can offset a height difference between a top surface of an interconnecting structure and a top surface of the bottom chip, which helps provide a surface having a same height for bonding the second chip, thereby reducing difficulty of bonding the second chip, and improving performance of connection of the second chip to the bottom chip and to the interconnecting structure.

Figures 4, 5, 6, 7, 8:
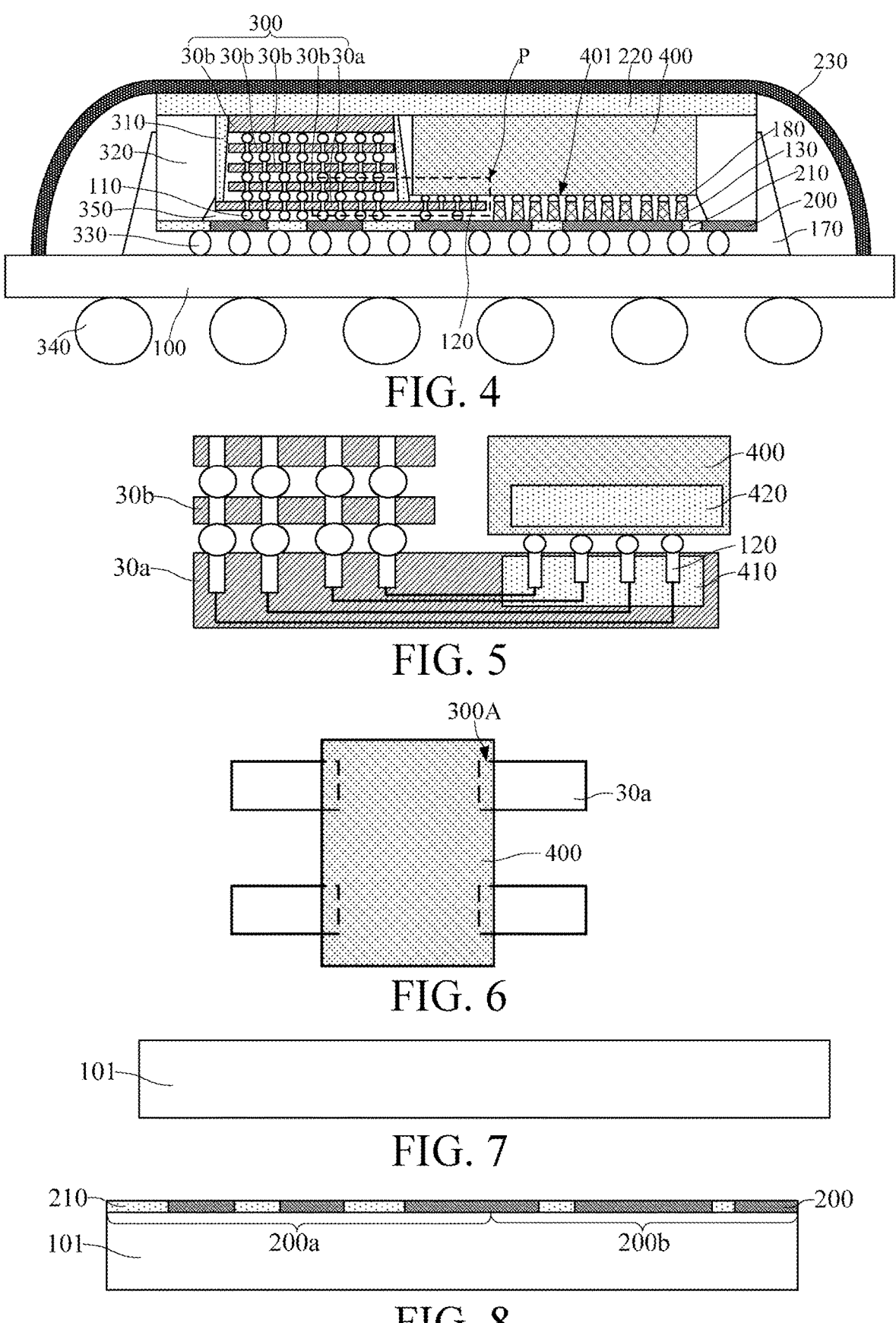

In order to make the foregoing objectives, features, and advantages of the forms of the present disclosure more apparent and easier to understand, specific forms of the present disclosure are described in detail below with reference to the accompanying drawings. FIG. 4 to FIG. 6 are schematic structural diagrams of a form of a packaging structure according to the present disclosure. FIG. 4 is a cross-sectional view, FIG. 5 is a partial enlarged view at a position P in FIG. 4, and FIG. 6 is a top view corresponding to FIG. 4.

As shown in FIG. 4 to FIG. 6, in this form, the packaging structure includes: a substrate 100; an interconnecting structure 200, bonded to the substrate 100, the interconnecting structure 200 is electrically connected to the substrate 100; a chipset 300, including a plurality of first chips 30 stacked along a longitudinal direction, where the first chip 30 adjacent to the interconnecting structure 200 is used as a bottom chip 30a, each of the rest of the first chips 30 is used as a top chip 30b, the bottom chip 30a is electrically connected to the interconnecting structure 200, adjacent first chips 30 along the longitudinal direction are electrically connected, and a portion of the bottom chip 30a is exposed from the top chip 30b; a conductive post 130, arranged on the interconnecting structure 200 on a side of the chipset 300 and electrically connected to the interconnecting structure 200; and a second chip 400, bonded to the bottom chip 30a exposed from the top chip 30b and to the conductive post 130, so that the second chip 400 is electrically connected to the bottom chip 30a and the conductive post 130.

The substrate 100 is configured to be bonded to the interconnecting structure 200, thereby realizing packaging integration and electrical integration of the chipset 300 and the second chip 200 with the substrate 100. Since the substrate 100 is electrically connected to the interconnecting structure 200, the substrate 100 can be electrically connected to the chipset 300 by the interconnecting structure 200, and the substrate 100 can be electrically connected to the second chip 400 by the interconnecting structure 200 and the conductive post 130.

In this form, the substrate 100 is a printed circuit board (PCB).

The interconnecting structure 200 is configured to electrically connect the chipset 300 to the substrate 100 and electrically connect the second chip 400 to the substrate 100. The interconnecting structure 200 is further configured to provide an operating platform for bonding the chipset 300 to the second chip 400.

Correspondingly, a material of the interconnecting structure 200 is a conductive material. Specifically, the material of the interconnecting structure 200 is metal, including any one or more of copper, titanium, aluminum, gold, nickel, iron, tin, silver, zinc, or chromium.

In this form, the interconnecting structure 200 is a redistribution structure (redistribution layer, RDL), for example. Specifically, the redistribution structure may include one or more redistribution layers. For ease of clear illustration, in this form, the redistribution structure includes one redistribution layer, for example.

In this form, a dielectric layer 210 is further formed between adjacent interconnecting structures 200, and the dielectric layer 210 is configured to electrically isolate adjacent interconnecting structures 200. In this form, a material of the dielectric layer 210 is an insulating material, such as one or more of silicon oxide, silicon nitride, or silicon oxynitride.

In this form, the packaging structure further includes third conductive bumps 330 arranged between the interconnecting structure 200 and the substrate 100. The third conductive bumps 330 are configured to electrically connect the interconnecting structure 200 to the substrate 100.

In this form, the third conductive bumps 330 are first solder balls. In this form, a material of each of the third conductive bumps 330 includes one or more of tin, copper, aluminum, tungsten, cobalt, nickel, titanium, tantalum, titanium nitride, or tantalum nitride. In an example, the material of the third conductive bump 330 is tin.

Specifically, the first solder ball is controlled collapse chip connection (C4). C4 has excellent electrical and thermal properties. C4 can achieve a higher I/O density, and is free of limitation by a size of the interconnecting structure 200. In addition, C4 is suitable for mass production and greatly reduces a size and a weight.

The packaging structure further includes a second sealing layer 170 filling a gap between adjacent third conductive bumps 330 between the interconnecting structure 200 and the substrate 100. The second sealing layer 170 is configured to seal the third conductive bumps 330. In an example, a material of the second sealing layer 170 is epoxy resin.

The chipset 300 is configured to be electrically connected to the second chip 400, to electrically connect the first chip 30 to the second chip 400, so as to form a corresponding packaging structure and realize corresponding functions.

In this form, in the chipset 300, the plurality of first chips 30 stacked along the longitudinal direction form a high band memory (HBM) structure. The HBM structure helps satisfy a demand for a higher information transmission speed.

The bottom chip 30a is electrically connected to the interconnecting structure 200. Therefore, the bottom chip 30b can be electrically connected to the substrate 100 by the interconnecting structure 200, thereby realizing a layout of a circuit structure according to an actual demand.

In this form, the packaging structure further includes first conductive bumps 110 arranged between the interconnecting structure 200 and the bottom chip 30a. The first conductive bumps 110 are configured to electrically connect the interconnecting structure 200 to the bottom chip 30a. In this form, a material of each of the first conductive bumps 110 includes one or more of tin, copper, aluminum, tungsten, cobalt, nickel, titanium, tantalum, titanium nitride, or tantalum nitride. In an example, the material of the first conductive bump 110 is tin.

In this form, adjacent first chips 30 along the longitudinal direction are electrically connected, thereby realizing electrical integration between the first chips 30. One or more top chips 30b may be arranged. In this form, four top chips 30b are arranged, for example. In other forms, another number of top chips may be arranged. In this form, the longitudinal direction is a direction perpendicular to a surface of the substrate.

In this form, the top chip 30b is a memory chip, for example, a DRAM chip. In this form, the bottom chip 30a is a first logic chip. Specifically, the bottom chip 30a is used as a logic control chip in the chipset 300 to control the memory chip.

In this form, along a direction parallel to a surface of the bottom chip 30a, a transverse dimension of the bottom chip 30a is greater than a transverse dimension of the top chip 30b, and a portion of the bottom chip 30a is exposed from the top chip 30b, so that a space can be provided for bonding the second chip 400 to the bottom chip 30a. Therefore, a portion of the second chip 400 can be bonded to the bottom chip 30a exposed from the top chip 30b.

In this form, a partial region on the bottom chip 30a exposed from the top chip 30b is a first connection region 300A (shown in FIG. 6). The first connection region 300A is configured to be bonded to a second connection region of the second chip 400, to electrically connect the bottom chip 30a to the second chip 400.

Specifically, referring to FIG. 5, a first interface circuit 410 is formed in the first connection region 300A. In this form, the first interface circuit 410 includes a connection structure 120 used as an external terminal of the first interface circuit 410. In a specific form, the connection structure 120 may be a through silicon via (TSV) interconnecting structure.

It should be noted that, a ratio of an area of the first connection region 300A to a total area of the bottom chip 30a is neither excessively small nor excessively large. An excessively small ratio tends to result in an excessively small space provided for bonding the second chip 400, which tends to increase difficulty of bonding the second chip 400 to the bottom chip 30a. An excessively large ratio tends to result in an excessively large area of the chipset 300, which tends to increase a transverse dimension of the packaging structure. Therefore, in this form, the ratio of the area of the first connection region 300A to the total area of the bottom chip 30a ranges from 5% to 20%.

In this form, the packaging structure further includes a first packaging layer 310 arranged on the bottom chip 30a exposed from the second chip 400 and covering a sidewall of the top chip 30b. The first packaging layer 310 is configured to protect the structure of the chipset 300, so as to realize packaging integration between the plurality of first chips 30. The first packaging layer 310 can further function to provide insulation, sealing, and moisture protection, thereby helping improve reliability of the chipset 300.

The first packaging layer 310 is arranged on the bottom chip 30a exposed from the second chip 400. That is, the first connection region 300A is exposed from the first packaging layer 310, thereby providing a space for bonding a portion of the second chip 400 to the bottom chip 30a.

In a form, a material of the first packaging layer 310 is a molding material, for example, epoxy resin. Epoxy resin has advantages such as low shrinkage, desirable viscosity, desirable corrosion resistance, excellent electrical properties, and low costs. In other forms, the first packaging layer may be made of other suitable packaging materials.

The conductive post 130 is configured to electrically connect the second chip 400 to the interconnecting structure 200. In addition, the conductive post 130 can reduce a height difference between a top surface of the interconnecting structure 200 and a top of the bottom chip 30a in the chipset 300, so that a relatively flat top surface can be provided for bonding the second chip 400, and correspondingly support can be provided for bonding the second chip 400, thereby reducing the difficulty of bonding the second chip 400.

Therefore, a height of the conductive post 130 depends on a height of the top surface of the bottom chip 30a.

In this form, the top surface of the conductive post 130 is flush with the top surface of the bottom chip 30a, so that a flat surface having the same height can be provided for bonding the second chip 400 to the bottom chip 30a and the conductive post 130, which helps further reduce the difficulty of bonding the second chip 400.

In other forms, when a height difference between the top surface of the conductive post and the top surface of the bottom chip is within a preset difference range, the height difference between the top surface of the interconnecting structure and the top surface of the bottom chip can also be offset.

In this form, a plurality of conductive posts 130 are arranged. The plurality of conductive posts 130 are separately arranged in the second interconnecting region 200b of the interconnecting structure 200.

A material of each of the conductive posts 130 is a conductive material. Specifically, the material of the conductive post 130 is metal, including any one or more of copper, titanium, aluminum, gold, nickel, iron, tin, silver, zinc, or chromium. In this form, the material of the conductive post 130 is copper, that is, the conductive post 130 is a copper post.

The second chip 400 is configured to be bonded to the bottom chip 30a, to electrically connect the second chip 400 to each first chip 30.

In this form, the second chip 400 is directly stacked on and bonded to the bottom chip 30a exposed from the top chip 30b, thereby electrically connecting the second chip 400 to the first chip 30. Compared with electrically connecting the second chip to the first chip by a bridge, in this form, the bridge is omitted, which helps simplify a packaging process and the packaging structure, thin the packaging structure, and shorten a transmission path between the second chip 400 and the first chip 30, thereby improving a speed of communication between the second chip 400 and the first chip 30, and optimizing performance of the packaging structure.

In this form, the second chip 400 is a second logic chip configured to perform logic control on the chipset 300. Specifically, the second logic chip may be a CPU chip, a GPU chip, or an SoC chip.

The second chip 400 has a first surface 401. The first surface 401 includes a second connection region 401 (with reference to FIG. 15 (a)) and a third connection region 4011 (with reference to FIG. 15 (a)).

The second connection region 401 is configured to be bonded to the first connection region 300A, to electrically connect the second chip 400 to the bottom chip 30a. The third connection region 4011 is configured to be bonded to the conductive post 130. Therefore, the second chip 400 can be electrically connected to the interconnecting structure 200 by the conductive post 130.

In this form, the second connection region 401 is arranged opposite to the first connection region 300A, and the third connection region 4011 is arranged opposite to the conductive post 130, so as to bond the second connection region 401 to the first connection region 300A and bond the third connection region 4011 to the conductive post 130.

Specifically, referring to FIG. 5, a second interface circuit 420 is formed in the second connection region 401. The second interface circuit 420 is arranged opposite to and electrically connected to the first interface circuit 410.

In this form, the packaging structure further includes second conductive bumps 180 arranged between the second connection region 401 and the first connection region 300A and between the third connection region 4011 and the conductive post 130.

The second conductive bumps 180 are configured to electrically connect the second connection region 401 to the first connection region 300A and electrically connect the third connection region 4011 to the conductive post 130, so as to electrically connect the second chip 400 to the bottom chip 30a and the conductive post 130. Correspondingly, the second interface circuit 420 is electrically connected to the first interface circuit 410 by the second conductive bumps 180.

It should be noted that, in this form, the second conductive bumps 180 located between the second connection region 401 and the first connection region 300A are microbumps (μbump), and the microbumps are arranged relatively densely, thereby helping improve the speed of communication between the second chip 400 and the bottom chip 30a.

In this form, the second conductive bumps 180 located between the third connection region 4011 and the conductive post 130 are C4. C4 has excellent electrical and thermal properties. In case of a same solder ball spacing, C4 can achieve a higher I/O density. In addition, C4 is suitable for mass production and greatly reduces a size and a weight.

In this form, a material of each of the second conductive bumps 180 includes one or more of tin, copper, aluminum, tungsten, cobalt, nickel, titanium, tantalum, titanium nitride, or tantalum nitride. In an example, the material of the second conductive bump 180 is tin.

In this form, the packaging structure further includes a first sealing layer 350 filling a gap between the bottom chip 30a and the interconnecting structure 200, between the third connection region 4011 and the interconnecting structure 200, and between the second connection region 401 and the first connection region 300A, so that the first sealing layer 350 seals the conductive post 130 and the second conductive bumps 180. Specifically, in this form, the first sealing layer 350 located between the bottom chip 30a and the interconnecting structure 200 fills a gap between adjacent first conductive bumps 110. Therefore, the first sealing layer 350 also seals the first conductive bumps 110.

The first sealing layer 350 is configured to fill the gap between adjacent first conductive bumps 110, a gap between adjacent second conductive bumps 180, and a gap between adjacent conductive posts 130, to seal the first conductive bumps 110, the second conductive bumps 180, and the conductive posts 130, so as to protect the first conductive bumps 110, the second conductive bumps 180, and the conductive posts 130, and correspondingly improve packaging reliability.

In an example, a material of the first sealing layer 350 is epoxy resin.

In this form, the packaging structure further includes a second packaging layer 320 arranged on the chipset 300 and on the interconnecting structure 200 on a side of the second chip 400. The second packaging layer 320 is configured to realize packaging integration of the chipset 300 with the second chip 400. The second packaging layer 320 can further function to provide insulation, sealing, and moisture protection, thereby helping improve the packaging reliability.

In a form, a material of the second packaging layer 320 is a molding material, for example, epoxy resin. Epoxy resin has advantages such as low shrinkage, desirable viscosity, desirable corrosion resistance, excellent electrical properties, and low costs. In other forms, the second packaging layer may be made of other suitable packaging materials.

In this form, the packaging structure further includes a thermally conductive layer 220 arranged on the chipset 300, the second chip 400, and the second packaging layer 320. The thermally conductive layer 220 is configured to realize heat conduction and heat dissipation.

In this form, a material of the thermally conductive layer 220 is a thermal interface material (TIM). For example, the material of the thermally conductive layer 220 is silica gel.

In this form, the packaging structure further includes a packaging housing 230 arranged on the substrate 100 and covering the chipset 300, the second chip 400, and the second packaging layer 320. Specifically, the packaging housing 230 is arranged on the thermally conductive layer 220 and is in contact with the thermally conductive layer 220, so that the thermally conductive layer 220 realizes heat dissipation.

The packaging housing 230 is configured for mechanical protection of the chips inside and transitional connection of chip electrodes to the outside, and helps ensure correct realization of various functional parameters of the chips and environmental conditions required when the circuit is used.

In this form, a material of the packaging housing 230 includes metal, that is, the packaging housing 230 is a metal packaging housing. In other forms, the packaging housing may be a plastic packaging housing, a ceramic packaging housing, or the like.

In this form, the packaging structure further includes fourth conductive bumps 340 arranged on a surface on a side of the substrate 100 facing away from the interconnecting structure 200. The fourth conductive bumps 340 are configured to electrically connect the packaging structure to the external circuit. In this form, the fourth conductive bumps 340 are second solder balls. In an example, a material of each of the second solder balls is tin.

Correspondingly, a form of the present disclosure provides a packaging method. FIG. 7 to FIG. 20 are schematic structural diagrams corresponding to steps in a form of a packaging method according to the present disclosure. The packaging method in this form is described in detail below with reference to the drawings.

Referring to FIG. 7, a carrier substrate 101 is provided (2101). The carrier substrate 101 is configured to provide a process operation platform for subsequent bonding of a chipset to a second chip.

In this form, the carrier substrate 101 is a carrier substrate wafer. In other forms, the carrier substrate may be other types of substrates. In this form, a material of the carrier substrate 101 may include one or more of silicon, glass, silicon oxide, or aluminum oxide.

Referring to FIG. 8, an interconnecting structure 200 is formed on the carrier substrate 101 (2102). The interconnecting structure 200 includes a first interconnecting region 200a configured to connect to a chipset and a second interconnecting region 200b configured to connect to a second chip (2103).

After the carrier substrate 101 is subsequently removed, the interconnecting structure 200 is configured to electrically connect the chipset to the substrate and electrically connect the second chip to the substrate. The interconnecting structure 200 is further configured to provide an operating platform for subsequently bonding the chipset to the second chip.

Correspondingly, a material of the interconnecting structure 200 is a conductive material. Specifically, the material of the interconnecting structure 200 is metal, including one or more of copper, titanium, aluminum, gold, nickel, iron, tin, silver, zinc, or chromium.

In this form, the interconnecting structure 200 is a redistribution structure, for example. Specifically, the redistribution structure may include one or more redistribution layers. In this form, for ease of clear illustration, the redistribution structure includes one redistribution layer, for example.

In this form, a dielectric layer 210 is further formed between adjacent interconnecting structures 200, and the dielectric layer 210 is configured to electrically isolate adjacent interconnecting structures 200. In this form, a material of the dielectric layer 210 is an insulating material, such as one or more of silicon oxide, silicon nitride, or silicon oxynitride.

Figures 9, 10, 11, 12, 13:
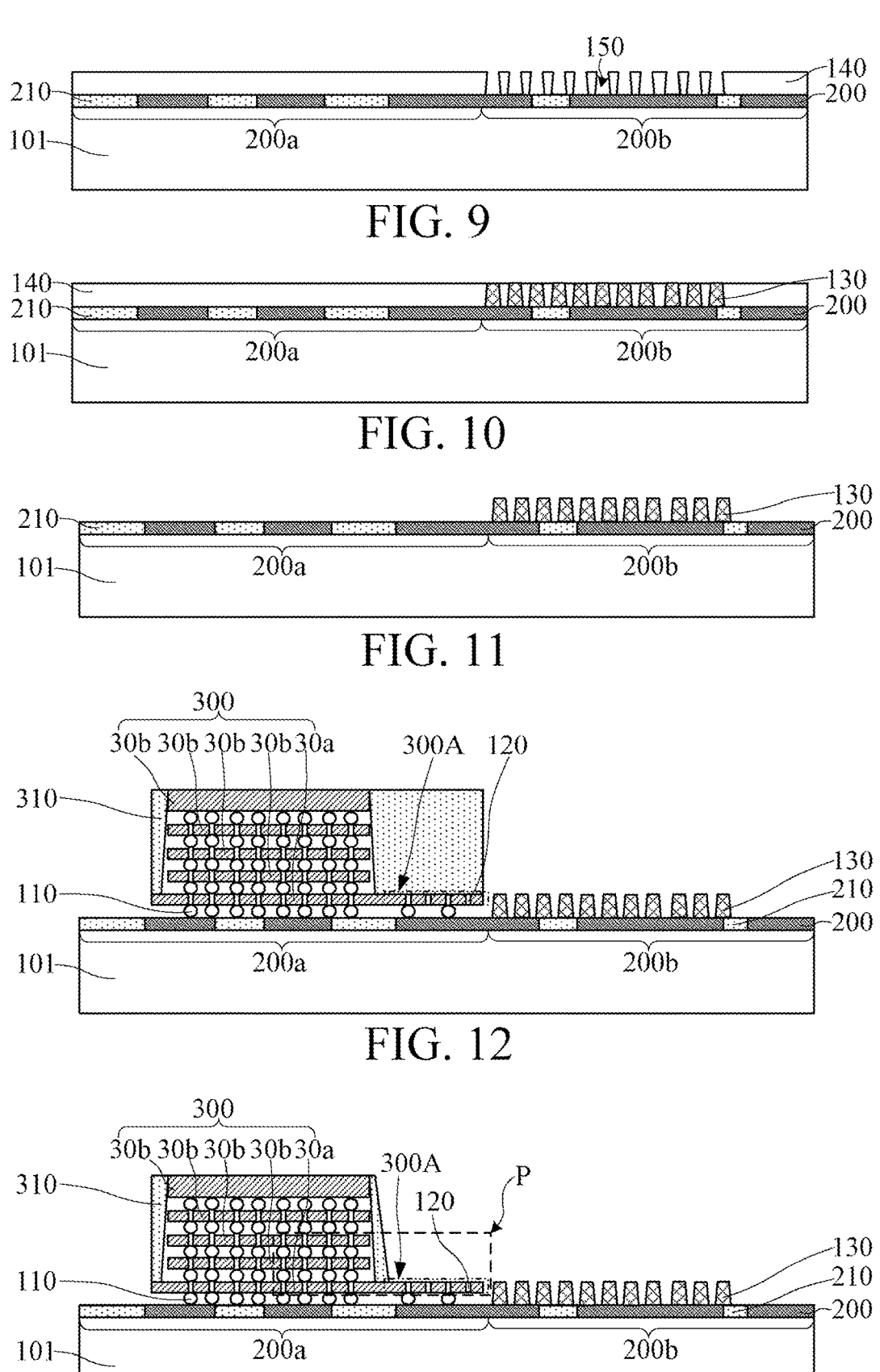

Referring to FIG. 9 to FIG. 11, a conductive post 130 is formed on the second interconnecting region 200b of the interconnecting structure 200 (2104). The conductive post 130 is electrically connected to the interconnecting structure 200.

The conductive post 130 is configured to subsequently electrically connect the second chip to the interconnecting structure 200. In addition, after the chipset is subsequently bonded to the first interconnecting region 200a of the interconnecting structure 200, the conductive post 130 can further reduce a height difference between a top surface of the interconnecting structure 200 and a top of the bottom chip in the chip set, so that a relatively flat top surface can be provided for subsequently bonding the second chip, and correspondingly support can be provided for subsequently bonding the second chip, thereby reducing process difficulty of subsequently bonding the second chip.

Therefore, a height of the conductive post 130 depends on a height of the top surface of the bottom chip after the chipset is subsequently bonded to the interconnecting structure 200.

In this form, a plurality of conductive posts 130 are arranged. The plurality of conductive posts 130 are separately arranged in the second interconnecting region 200b of the interconnecting structure 200.

A material of each of the conductive posts 130 is a conductive material. Specifically, the material of the conductive post 130 is metal, including any one or more of copper, titanium, aluminum, gold, nickel, iron, tin, silver, zinc, or chromium. In this form, the material of the conductive post 130 is copper, that is, the conductive post 130 is a copper post.

In this form, the step of forming the conductive post 130 includes:

forming a patterned layer 140 on the interconnecting structure 200, as shown in FIG. 9. A via 150 extending through the patterned layer 140 on a side of the chipset 300 is formed in the patterned layer 140, and the interconnecting structure 200 in the second intercon-necting region 200b is exposed from at least part of the via 150. The patterned layer 140 is configured to provide support for the formation of the conductive post. The via 150 is configured to define a position, a size, and a shape of the conductive post.

As shown in FIG. 10, the conductive post 130 filling the via 150 is formed. In this form, a process for filling the via 150 includes one or two of a chemical vapor deposition process, a physical vapor deposition process, or an electro-chemical plating process.

As shown in FIG. 11, the patterned layer 140 is removed to expose a surface of the interconnecting structure 200.

Referring to FIG. 12 to FIG. 14, a chipset 300 is bonded to the first interconnecting region 200a of the interconnect-ing structure 200. The chipset 300 includes a plurality of first chips 30 stacked along a longitudinal direction, the first chip 30 adjacent to the interconnecting structure 200 is used as a bottom chip 30a, each of the rest of the first chips 30 is used as a top chip 30b, the bottom chip 30b is electrically connected to the interconnecting structure 200, adjacent first chips 30 along the longitudinal direction are electrically connected, and a portion of the bottom chip 30a is exposed from the top chip 30b.

The chipset 300 is configured to be subsequently electri-cally connected to the second chip, to electrically connect the first chip 30 to the second chip, so as to form a corresponding packaging structure and realize correspond-ing functions.

In this form, in the chipset 300, the plurality of first chips 30 stacked along the longitudinal direction form a high band memory (HBM) structure. The HBM structure helps satisfy a demand for a higher information transmission speed.

The bottom chip 30b is electrically connected to the interconnecting structure 200. Therefore, the bottom chip 30b can be subsequently electrically connected to the sub-strate by the interconnecting structure 200, thereby realizing a layout of a circuit structure according to an actual demand.

In this form, the bottom chip 30b is electrically connected to the interconnecting structure 200 by first conductive bumps 110, for example. In this form, a material of each of the first conductive bumps 110 includes one or more of tin, copper, aluminum, tungsten, cobalt, nickel, titanium, tanta-lum, titanium nitride, or tantalum nitride. In an example, the material of the first conductive bump 110 is tin.

Specifically, the first conductive bumps 110 may be formed on either or both of the first interconnecting region 200a of the interconnecting structure 200 or a bottom of the bottom chip 30b, and then the first conductive bumps 110 are used to realize bonding.

In this form, adjacent first chips 30 along the longitudinal direction are electrically connected, thereby realizing elec-trical integration between the first chips 30. One or more top chips 30b may be arranged. In this form, four top chips 30b are arranged, for example. In other forms, another number of top chips may be arranged.

In this form, the top chip 30b is a memory chip, for example, a DRAM chip. In this form, the bottom chip 30a is a first logic chip. Specifically, the bottom chip 30a is used as a logic control chip in the chipset 300 to control the memory chip.

In this form, along a surface of the bottom chip 30a, a transverse dimension of the bottom chip 30a is greater than a transverse dimension of the top chip 30b, and a portion of the bottom chip 30a is exposed from the top chip 30b, so that a space can be provided for bonding the second chip to the bottom chip 30a. Therefore, a portion of the second chip can be subsequently bonded to the bottom chip 30a exposed from the top chip 30b.

A partial region on the bottom chip 30a exposed from the top chip 30b is a first connection region 300A.

It should be noted that, a ratio of an area of the first connection region 300A to a total area of the bottom chip 30a is neither excessively small nor excessively large. An excessively small ratio tends to result in an excessively small space provided for bonding the second chip, which tends to increase difficulty of bonding the second chip to the bottom chip 30a. An excessively large ratio tends to result in an excessively large area of the chipset 300, which tends to increase a transverse dimension of the packaging structure. Therefore, in this form, the ratio of the area of the first connection region 300A to the total area of the bottom chip 30a ranges from 5% to 20%.

FIG. 14 is a partially enlarged view at a position P in FIG. 13. Specifically, in this form, a first interface circuit 410 is formed in the first connection region 300A. The first inter-face circuit 410 is configured to be electrically connected to the subsequent second chip.

In this form, the first interface circuit 410 includes a connection structure 120 used as an external terminal of the first interface circuit 410. During specific implementation, the connection structure 120 may be a TSV interconnecting structure.

It should be noted that, in this form, the chipset 300 is bonded to the first interconnecting region 200a of the interconnecting structure 200 after the conductive post 130 is formed, for example. In other forms, the conductive post may be formed after the chipset is bonded to the first interconnecting region of the interconnecting structure.

It should be further noted that, in this form, after the conductive post 130 is formed and the chipset 300 is bonded to the first interconnecting region 200a of the interconnect-ing structure 200, a top surface of the conductive post 130 is flush with a top surface of the bottom chip 30a, so that a flat surface having a same height can be provided for subsequently bonding the second chip to the bottom chip 30a and the conductive post 130, which helps reduce the difficulty of bonding the second chip.

In other forms, when a height difference between the top surface of the conductive post and the top surface of the bottom chip is within a preset difference range, the height difference between the top surface of the interconnecting structure and the top surface of the bottom chip can also be offset.

Referring to FIG. 12, in this form, a chipset 300 is provided and a first packaging layer 310 is formed on the bottom chip on a side of the top chip after the interconnect-ing structure 200 is formed and before the chipset 300 is bonded to the interconnecting structure 200. The first pack-aging layer 310 covers the first connection region 300A.

The first packaging layer 310 is configured to protect the structure of the chipset 300, so as to realize packaging integration between the plurality of first chips 30. The first packaging layer 310 can further function to provide insula-tion, sealing, and moisture protection, thereby helping improve reliability of the chipset 300.

In a form, a material of the first packaging layer 310 is a molding material, for example, epoxy resin. Epoxy resin has advantages such as low shrinkage, desirable viscosity, desir-able corrosion resistance, excellent electrical properties, and low costs. In other forms, the first packaging layer may be made of other suitable packaging materials.

Correspondingly, in this form, the first packaging layer 310 is formed by a molding process. In other forms, the first packaging layer may be formed by other proper processes based on an actual process.

In this form, the first packaging layer 310 covers the first connection region 300A. Therefore, referring to FIG. 13, after the chipset 300 is provided and before the second chip is bonded to the bottom chip 30a exposed from the top chip 30b and to the conductive post 130, the first packaging layer 310 located in the first connection region 300A is removed to expose the first connection region 300A, thereby providing a space for subsequently bonding the second chip to the first connection region 300A.

Specifically, in this form, the first packaging layer 310 located in the first connection region 300A is removed a dry etching process.

It should be noted that, in this form, the first packaging layer 310 located in the first connection region 300A is removed after the chipset 300 is bonded to the interconnecting structure 200 and before the second chip is bonded to the bottom chip 30a exposed from the top chip 30b and to the conductive post 130, for example. In other forms, the first packaging layer located in the first connection region may be removed after the chipset is provided and before the chipset is bonded to the interconnecting structure.

Referring to FIG. 15 (a), a second chip 400 is provided (2105). The second chip 400 is configured to be subsequently bonded to the bottom chip 30a, to electrically connect the second chip 400 to each first chip 30.

In this form, the second chip 400 is a second logic chip configured to perform logic control on the chipset 300. Specifically, the second logic chip may be a CPU chip, a GPU chip, or an SoC chip.

The second chip 400 has a first surface 401. The first surface 401 includes a second connection region 401 and a third connection region 4011. During subsequent bonding of the second chip 400 to the first connection region 300A, the second connection region 401 is configured to be bonded to the first connection region 300A, to electrically connect the second chip 400 to the bottom chip 30a.

Specifically, a second interface circuit 420 is formed in the second connection region 401. The second interface circuit 420 is configured to be electrically connected to the first interface circuit 410, thereby electrically connecting the second chip 400 to the bottom chip 30a.

Figure 17:
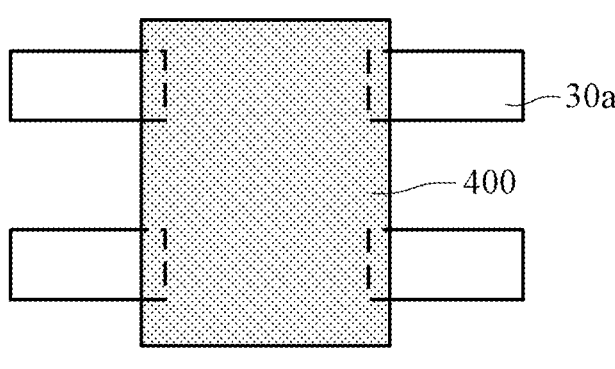

Referring to FIG. 15 (b) to FIG. 17, FIG. 15 (b) is a cross-sectional view, FIG. 16 is a partial enlarged view at a position Pin FIG. 15 (b), and FIG. 17 is a top view corresponding to FIG. 15 (b). A second chip 400 is bonded to the bottom chip 30a exposed from the top chip 30b and to the conductive post 130, so that the second chip 400 is electrically connected to the bottom chip 30a and the conductive post 130 (2106).

Since a portion of the bottom chip 30a is exposed from the top chip 30b, a space can be provided for bonding a portion of the second chip 400 to the bottom chip 30a, so that the second chip 400 can be directly stacked on and bonded to the bottom chip 30a exposed from the top chip 30b, thereby electrically connecting the second chip 400 to the first chip 30. Compared with electrically connecting the second chip to the first chip by a bridge, in this form, the bridge is omitted, which helps simplify a packaging process and the packaging structure, thin the packaging structure, and shorten a transmission path between the second chip 400 and the first chip 30, thereby improving a speed of communication between the second chip 400 and the first chip 30, and optimizing performance of the packaging structure.

In this form, after the second chip 400 is bonded to the bottom chip 30a exposed from the top chip 30b and to the conductive post 130, the second interface circuit 420 and the first interface circuit 410 are arranged oppositely and are electrically connected, and the third connection region 4011 and the conductive post 130 are arranged oppositely and are electrically connected.

In this form, the second connection region 401 is electrically connected to the first connection region 300A and the third connection region 4011 is electrically connected to the conductive post 130 by the second conductive bumps 180. The second conductive bumps 180 are configured to electrically connect the second connection region 401 to the first connection region 300A and electrically connect the third connection region 4011 to the conductive post 130, so as to electrically connect the second chip 400 to the bottom chip 30a and the conductive post 130.

Correspondingly, the second interface circuit 420 is electrically connected to the first interface circuit 410 by the second conductive bumps 180.

In this form, the second conductive bumps 180 located between the second connection region 401 and the first connection region 300A are microbumps, and the microbumps are arranged relatively densely, thereby helping improve the speed of communication between the second chip 400 and the bottom chip 30a.

In this form, the second conductive bumps located between the third connection region 4011 and the conductive post 130 are C4. C4 has excellent electrical and thermal properties. In case of a same solder ball spacing, C4 can achieve a higher I/O density. In addition, C4 is suitable for mass production and greatly reduces a size and a weight.

In this form, a material of each of the second conductive bumps 180 includes one or more of tin, copper, aluminum, tungsten, cobalt, nickel, titanium, tantalum, titanium nitride, or tantalum nitride. In an example, the material of the second conductive bump 180 is tin.

Specifically, in this form, the step of bonding the second chip 400 to the bottom chip 30a exposed from the top chip 30b and to the conductive post 130 includes: forming second conductive bumps 180 in the second connection region 401 and the third connection region 4011; and bonding the second conductive bumps 180 to the first connection region 300A and the conductive post 130.

In other forms, the second conductive bumps may be formed on the first connection region and the conductive post; and the second conductive bumps are bonded to second connection region and third connection region. Alternatively, first conductive sub-bumps are formed in the second connection region and the third connection region; second conductive sub-bumps are formed on the first connection region and the conductive post; and the first conductive sub-bumps are bonded to the second conductive sub-bumps.

Figure 18:
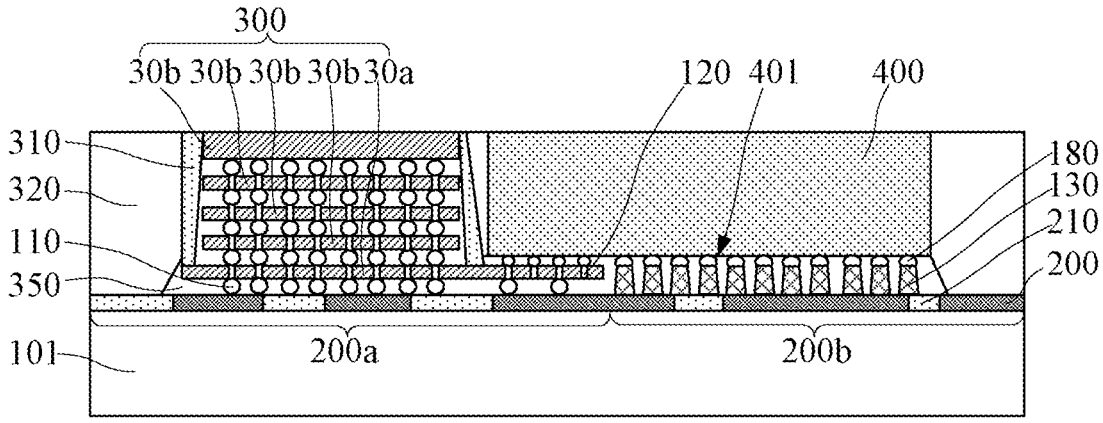

Referring to FIG. 18, in this form, the packaging method further includes: forming a first sealing layer 350 filling a gap between the bottom chip 30a and the interconnecting structure 200, between the third connection region 4011 and the interconnecting structure 200, and between the second connection region 401 and the first connection region 300A, so that the first sealing layer 350 seals the conductive post 130 and the second conductive bumps 180. Specifically, in this form, the first sealing layer 350 located between the bottom chip 30a and the interconnecting structure 200 fills a gap between adjacent first conductive bumps 110. Therefore, the first sealing layer 350 also seals the first conductive bumps 110.

The first sealing layer 350 is configured to fill the gap between adjacent first conductive bumps 110, a gap between adjacent second conductive bumps 180, and a gap between adjacent conductive posts 130, to seal the first conductive bumps 110, the second conductive bumps 180, and the conductive posts 130, so as to protect the first conductive bumps 110, the second conductive bumps 180, and the conductive posts 130, and correspondingly improve packaging reliability.

In an example, a material of the first sealing layer 350 is epoxy resin. Specifically, in this form, the first sealing layer 350 is formed by an underfill process.

Referring to FIG. 18, the packaging method further includes: forming a second packaging layer 320 on the chipset 300 and on the interconnecting structure 200 on a side of the second chip 400 after bonding the second chip 400 to the bottom chip 30*a* exposed from the top chip 30*b* and to the conductive post 130.

The second packaging layer 320 is configured to realize packaging integration of the chipset 300 with the second chip 400. The second packaging layer 320 can further function to provide insulation, sealing, and moisture protection, thereby helping improve the packaging reliability.

In a form, a material of the second packaging layer 320 is a molding material, for example, epoxy resin. Epoxy resin has advantages such as low shrinkage, desirable viscosity, desirable corrosion resistance, excellent electrical properties, and low costs. In other forms, the second packaging layer may be made of other suitable packaging materials.

In this form, the step of forming the second packaging layer 320 includes: forming, on the interconnecting structure 200, a packaging material layer (not shown) covering the chipset 300 and the second chip 400, where the packaging material layer further covers tops of the chipset 300 and the second chip 400; and removing the packaging material layer on the tops of the chipset 300 and the second chip 400.

In this form, the packaging material layer is formed by a molding process. In other forms, the packaging material layer may be formed by other proper processes based on an actual process demand.

In this form, the packaging material layer on the tops of the chipset 300 and the second chip 400 is removed by a grinding process, to improve a flatness of a top surface of the second packaging layer 320, thereby facilitating a subsequent process.

Figure 19:
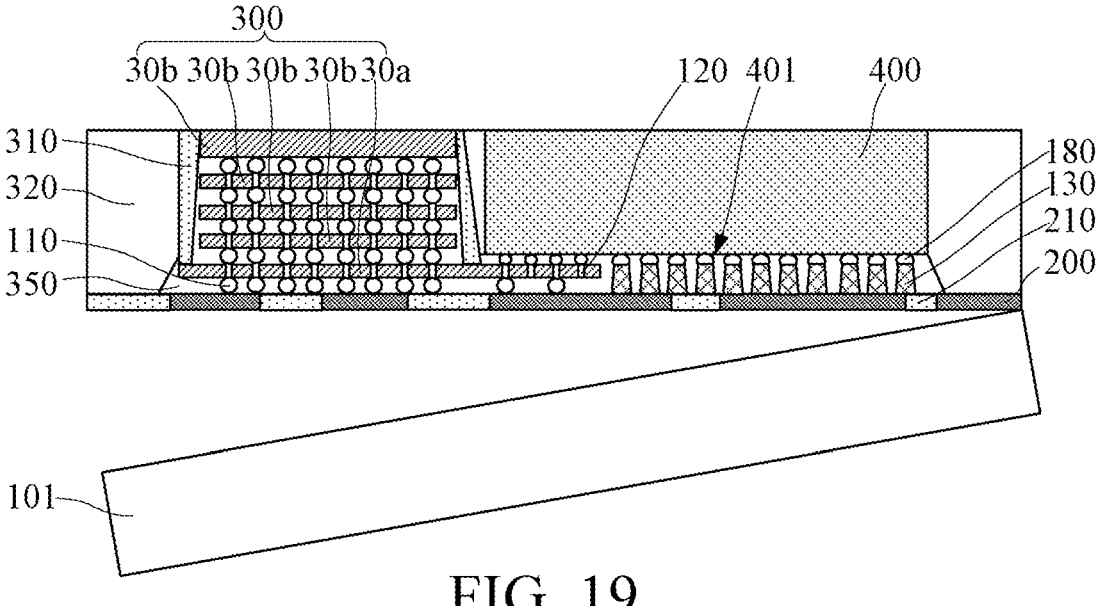

Referring to FIG. 19, the carrier substrate 101 is removed to expose a side of the interconnecting structure 200 facing away from the chipset 300 and the second chip 400, so as to subsequently electrically connect the side of the interconnecting structure 200 facing away from the chipset 300 and the second chip 400 to the substrate (2107). Specifically, the carrier substrate 101 is removed by a debonding process.

Figure 20:
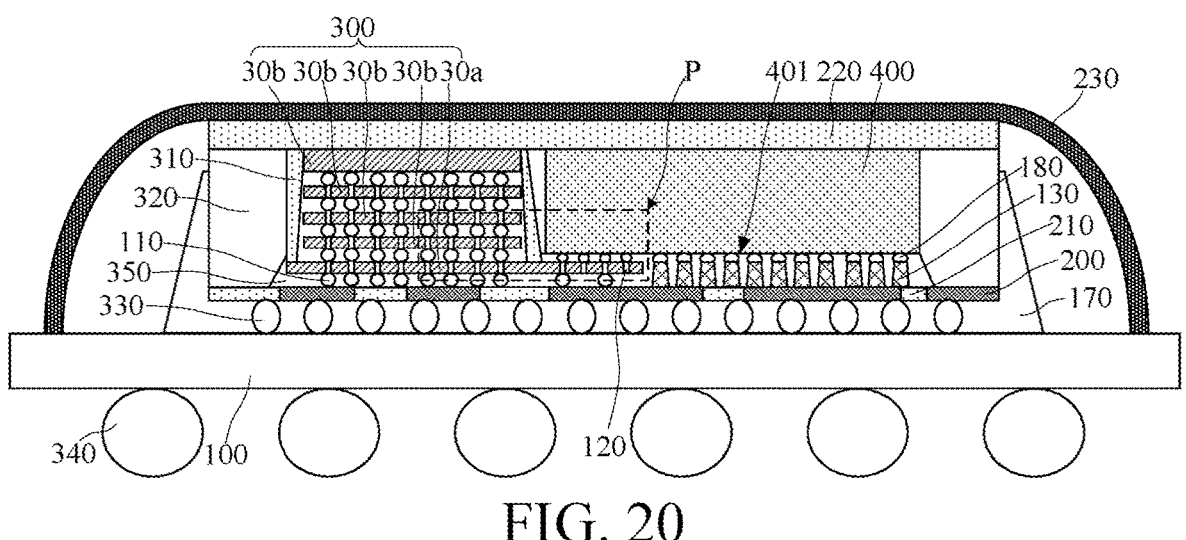
Figure 21:
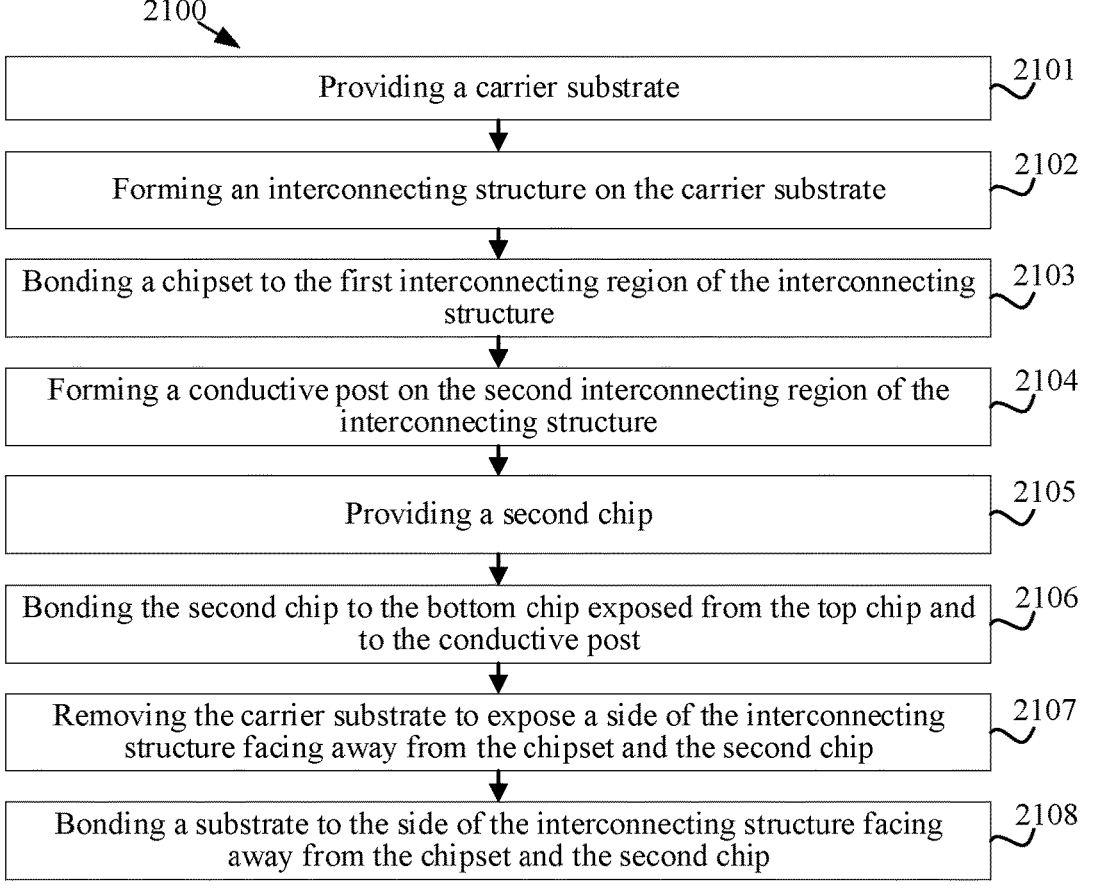
FIG. 21 is a flowchart of a packaging method according to a form of the present disclosure.

Referring to FIG. 20, a substrate 100 is bonded to the side of the interconnecting structure 200 facing away from the chipset 300 and the second chip 200, the substrate 100 is electrically connected to the interconnecting structure 200 (2108).

By bonding the interconnecting structure 200 to the substrate 100, packaging integration and electrical integration of the chipset 300 and the second chip 400 with the substrate 100 are realized. Since the substrate 100 is electrically connected to the interconnecting structure 200, the substrate 100 can be electrically connected to the chipset 300 by the interconnecting structure 200, and the substrate

100 can be electrically connected to the second chip 400 by the interconnecting structure 200 and the conductive post 130.

In this form, the substrate 100 is a PCB.

In this form, the interconnecting structure 200 is bonded to the substrate 100 by the third conductive bumps 330. Specifically, the third conductive bumps 330 may be formed on either or both of the interconnecting structure 200 or the substrate 100, the interconnecting structure 200 can be electrically connected to the substrate 100 by the third conductive bumps 330.

In this form, the third conductive bumps 330 are first solder balls. In this form, a material of each of the third conductive bumps 330 includes one or more of tin, copper, aluminum, tungsten, cobalt, nickel, titanium, tantalum, titanium nitride, or tantalum nitride. In an example, the material of the third conductive bump 330 is tin.

Specifically, the first solder ball is C4. C4 has excellent electrical and thermal properties. In case of a same solder ball spacing, C4 can achieve a higher I/O density, and is free of limitation by a size of the interconnecting structure 200. In addition, C4 is suitable for mass production and greatly reduces a size and a weight.

In this form, after the interconnecting structure 200 is bonded to the substrate 100, an underfill process is further performed. A gap between adjacent third conductive bumps 330 between the interconnecting structure 200 and the substrate 100 is filled with a second sealing layer 170, to seal the third conductive bumps 330.

In an example, a material of the second sealing layer 170 is epoxy resin.

It should be further noted that, after the interconnecting structure 200 is bonded to the substrate 100, the packaging method further includes: forming a thermally conductive layer 220 on the chipset 300, the second chip 400, and the second packaging layer 320. The thermally conductive layer 220 is configured to realize heat conduction and heat dissipation.

In this form, a material of the thermally conductive layer 220 is a TIM. For example, the material of the thermally conductive layer 220 is silica gel.

In this form, the packaging method further includes: forming a packaging housing 230 on the substrate 100 after forming the thermally conductive layer 220, where the packaging housing 230 covers the chipset 300, the second chip 400, and the second packaging layer 320. Specifically, the packaging housing 230 is arranged on the thermally conductive layer 220 and is in contact with the thermally conductive layer 220, so that the thermally conductive layer 220 realizes heat dissipation.

The packaging housing 230 is configured for mechanical protection of the chips inside and transitional connection of chip electrodes to the outside, and ensuring correct realization of various functional parameters of the chips and environmental conditions required when the circuit is used.

In this form, a material of the packaging housing 230 includes metal. In other forms, the packaging housing may be a plastic packaging housing, a ceramic packaging housing, or the like.

In this form, the packaging method further includes: forming fourth conductive bumps 340 on a surface on a side of the substrate 100 facing away from the interconnecting structure 200, to electrically connect the packaging structure to an external circuit.

In this form, the fourth conductive bumps 340 are second solder balls. In an example, a material of each of the second solder balls is tin.

Although the present disclosure is disclosed above, the present disclosure is not limited thereto. Any person skilled in the art can make various changes and modifications without departing from the spirit and the scope of the present disclosure. Therefore, the protection scope of the present disclosure should be subject to the scope defined by the claims.

What is claimed is:

1. A packaging structure, comprising:

a substrate;

an interconnecting structure, bonded to the substrate, wherein the interconnecting structure is electrically connected to the substrate;

a chipset, comprising a plurality of first chips stacked along a longitudinal direction, wherein a first chip of the plurality of first chips that is adjacent to the interconnecting structure is used as a bottom chip, each of the rest of the first chips is used as a top chip, the bottom chip is electrically connected to the interconnecting structure, adjacent first chips along the longitudinal direction are electrically connected, and a portion of the bottom chip is exposed from the top chip;

a conductive post, arranged on the interconnecting structure on a side of the chipset and electrically connected to the interconnecting structure; and a second chip, directly stacked on and bonded to the bottom chip exposed from the top chip and to the conductive post, the second chip is electrically connected to the bottom chip and the conductive post;

wherein a top surface of the bottom chip and a top surface of the conductive post are substantially coplanar.

2. The packaging structure according to claim 1, wherein the interconnecting structure is a redistribution structure, and the redistribution structure comprises at least one redistribution layer.

3. The packaging structure according to claim 1, further comprising first conductive bumps arranged between the interconnecting structure and the bottom chip.

4. The packaging structure according to claim 1, wherein:

a partial region on the bottom chip exposed from the top chip is a first connection region;

the second chip comprises a first surface, the first surface comprises a second connection region and a third connection region, the second connection region is arranged opposite to the first connection region, and the third connection region is arranged opposite to the conductive post; and the packaging structure further comprises second conductive bumps arranged between the second connection region and the first connection region and between the third connection region and the conductive post.

5. The packaging structure according to claim 4, further comprising a first sealing layer filling a gap between the bottom chip and the interconnecting structure, between the third connection region and the interconnecting structure, and between the second connection region and the first connection region, to seal the conductive post and the second conductive bumps.

6. The packaging structure according to claim 1, further comprising third conductive bumps arranged between the interconnecting structure and the substrate.

7. The packaging structure according to claim 6, further comprising a second sealing layer filling a gap between adjacent third conductive bumps between the interconnecting structure and the substrate.

8. The packaging structure according to claim 1, further comprising fourth conductive bumps arranged on a surface on a side of the substrate facing away from the interconnecting structure.

9. The packaging structure according to claim 1, further comprising a first packaging layer arranged on the bottom chip exposed from the second chip and covering a sidewall of the top chip.

10. The packaging structure according to claim 1, further comprising a second packaging layer arranged on the chipset and on the interconnecting structure on a side of the second chip.

11. The packaging structure according to claim 1, wherein a top surface of the conductive post is flush with a top surface of the bottom chip.

12. The packaging structure according to claim 1, wherein a partial region on the bottom chip exposed from the top chip is a first connection region, and a ratio of an area of the first connection region to a total area of the bottom chip ranges from 5% to 20%.

13. The packaging structure according to claim 1, wherein the bottom chip is a first logic chip, the top chip is a memory chip, and the second chip is a second logic chip.

14. The packaging structure according to claim 1, further comprising:

a thermally conductive layer, arranged on the chipset and the second chip; and a packaging housing, arranged on the substrate, configured to package the chipset and the second chip, and in contact with the thermally conductive layer.

* * * * *